United States Patent [19]
Bui et al.

[11] Patent Number: 5,966,024
[45] Date of Patent: Oct. 12, 1999

[54] SENSITIVE METHOD OF EVALUATING PROCESS INDUCED DAMAGE IN MOSFETS USING A DIFFERENTIAL AMPLIFIER OPERATIONAL PRINCIPLE

[75] Inventors: Nguyen D. Bui, San Jose; Scott Zheng, Sunnyvale, both of Calif.

[73] Assignee: Advanced Micro Devices, Inc., Sunnyvale, Calif.

[21] Appl. No.: 08/784,325

[22] Filed: Jan. 16, 1997

[51] Int. Cl.[6] .................................................. G01R 31/26
[52] U.S. Cl. .......................... 324/763; 324/765; 324/769
[58] Field of Search ................................. 324/763, 765, 324/766, 769

[56] References Cited

U.S. PATENT DOCUMENTS

5,548,224  8/1996  Gabriel et al. ........................... 324/765
5,625,288  4/1997  Snyder et al. ........................... 324/763
5,638,006  6/1997  Nariani et al. .......................... 324/765

*Primary Examiner*—Glenn W. Brown

[57] ABSTRACT

Techniques for measuring process induced damage, such as damage experienced during plasma etching or ion implementation, utilize a differential amplifier having multi-layer antennas (capacitors) of different sizes formed on respective inputs. Measurement of $\Delta$Ids (the difference between $Ids_1$ and $Ids_2$ off a MOSFET of the differential pair) or $\Delta$Idlin provides a sensitive and accurate measure of process induced damage. The techniques can be applied to monitor process induced damage while the manufacturing process is ongoing or as a measure of quality of the finished product.

4 Claims, 15 Drawing Sheets

SENSITIVE METHOD OF EVALUATING PROCESS INDUCED DAMAGE IN MOSFETS USING A DIFFERENTIAL AMPLIFIER OPERATIONAL PRINCIPLE

TECHNICAL FIELD

The invention relates to semiconductor fabrication and, more particularly, to detecting and evaluating process damage, caused by potentially destructive process steps such as plasma etching or ion implantation during fabrication of semiconductor devices.

BACKGROUND ART

During fabrication of semiconductor devices, techniques which are potentially destructive, such as plasma etching and ion implantation, are utilized modify the surface of the semiconductor at certain stages of manufacture. Because of the small geometries involved, destructive techniques can impact portions of the circuitry not intended to be treated. This can result in a degradation of performance of the fabricated semiconductor device. It would, therefore, be desirable to have a way of determining the amount of process induced damage which occurs during fabrication of a semiconductor device.

In the prior art, it is common to characterize semiconductor devices by measuring a plurality of parameters, such as Vtlin, Vtsat, Idlin, Idsat, Idoff and Gm. The results of each of those measurements were then evaluated as a measure of quality of the fabricated device. The quality of the fabricated device is inversely related to process induced damage. The problems with the prior art techniques include the necessity of making a plurality of measurements and the difficulty of interpreting a plurality of measurements in order to determine the quality of the end product.

DISCLOSURE OF THE INVENTION

The invention overcomes the problems of the prior art by providing methods, apparatus and systems for detecting the amount of process induced damage. This is done with a single test which in many cases can eliminate the plurality of tests and the difficulties of interpretation of the prior art and provides a single measure of quality of the fabricated device.

In accordance with the invention, a differential amplifier is implemented on the semiconductor chip and provided with different sized antenna on each input gate. When damaging fabrication techniques such as plasma etching or ion implant procedures are undertaken subsequently, damage to the gate oxide (GOX) of the transistor which is connected to the different sized antennas will be sustained in different amounts resulting in a difference between the values of Ids for the input transistors. This $\Delta$Ids measured at Vgs=Vth+(between 20–25% of Vth) and at Vds>Vgs–Vth results in a change in the offset voltage for the differential amplifier. The inventors have discovered that $\Delta$Ids can be utilized as a very sensitive, accurate and reliable indicator of process induced damage. Idlin, though not preferred, has similar properties. Measurement of $\Delta$Ids of a MOSFET for a differential amplifier subjected to process induced damage can then be utilized as a direct measure of the amount of process induced damage. As a result, a single measurement for many purposes can replace the plurality of measurements of the prior art and accurately determine the quality of the fabrication.

The invention is directed to a method of evaluating process induced damage during fabrication of a semiconductor product by forming a differential amplifier having different sized antennas on the semiconductor product during fabrication, and measuring $\Delta$Ids or $\Delta$Idlin for the MOSFET for the differential amplifier as an indication of the amount of process induced damage the product suffered during fabrication. The products can be a semiconductor wafer, an integrated circuit or one or more MOSFETs.

The invention is also directed to a semiconductor product having differential amplifier formed thereon, the differential amplifier having different sized antennas formed on its inputs.

The invention is also directed to a system for measuring induced damage on a semiconductor product having at least one differential amplifier formed thereon, the differential amplifier having different sized antennas formed on respective inputs. The system includes a test instrument, or more test fixtures holding the semiconductor product and providing connections between the test instrument and at least one of the differential amplifier to be tested, and a computer for controlling the test instrument and the test fixture to measure $\Delta$Ids or $\Delta$Idlin for the MOSFET for the differential amplifier after one or more fabrication steps. The measurement is an indication of the amount of process induced damage the product suffered during those fabrication steps.

The invention is also directed to a method of evaluating process induced damage during fabrication of a semiconductor product, by forming a differential amplifier having different sized antennas on a semiconductor product prior to fabrication, and measuring $\Delta$Ids or $\Delta$Idlin for the MOSFET for the differential amplifier after one or more fabrication steps as an indication of the amount of process induced damage the product suffered during those fabrication steps.

The invention is also directed to a method of evaluating quality of a fabricated semiconductor product using a single parameter, by measuring $\Delta$Ids or $\Delta$Idlin at Vgs=Vcc (the maximum operating voltage for MOSFET of a particular technology where Vds=0.1V) for the MOSFET of a differential amplifier formed on the product, the differential amplifier having different sized antennas on each input. The values of the $\Delta$ids or $\Delta$Idlin at Vgs=Vcc (the maximum operating voltage for MOSFET of a particular technology where Vds=0.1V) for the MOSFET are used to develop statistics about processed induced damage.

Still other objects and advantages of the present invention will become readily apparent to those skilled in the art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

DETAILED DISCLOSURE OF THE INVENTION

Introduction to the differential amplifier circuit used to carry out the research.

Figure 1:
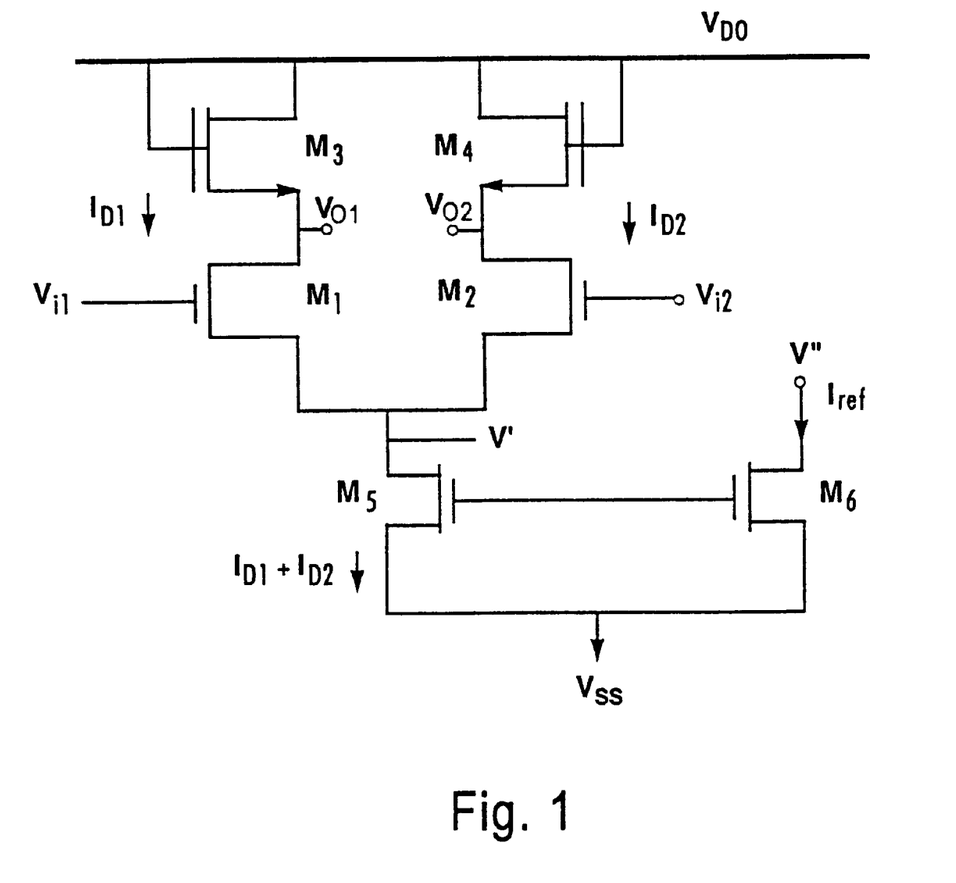
FIG. 1 is a schematic diagram of a differential amplifier configuration of a type useful in carrying out the invention.

Notation and terminology used here in referred to in the circuit diagram shown in FIG. 1.

Vo=Vo1−Vo2 is the differential output voltage across two output nodes.

Vcm=Vi1=Vi2 applied to the input of the circuits.

Voffset=Vo1−Vo2 is the offset voltage across two output nodes when the input modes are biased properly to cause all devices in the circuit to operate in saturation.

Vid=Vi1−Vi2 is the input differential voltage.

Aid=$\Delta$Vo/$\Delta$Vid is the differential gain of the circuit.

Vidmax is the maximum allowable differential input voltage in order to preserve the linear differential output mode.

$$Vgs1 = Vi1 - V'$$

$$Vgs2 = Vi2 - V'$$

Vt1 and Gm1 are the threshold voltage and transconductance of M1, respectively.

Vt2 and Gm2 are the threshold voltage and transconductance of M2, respectively.

$\Delta$Vt=Vt1−Vt2 of the same differential amplifier pair.

$\Delta$Gm=Gm1−Gm2 of the same differential amplifier pair.

Intrinsic mismatch is the mismatch in Vt, W (channel width), and L (channel length) due to process variation and the process environment, and has nothing to do with the size of antennas discussed hereinafter.

For the experiment, the devices used has channel widths and lengths as follows:

M1, M2: W=50 $\mu$m L=2 $\mu$m
M3, M4: W=2 $\mu$m L=5 $\mu$m
M5, M6: W=10.5 $\mu$m L=2 $\mu$ $$A_{id} = \frac{\Delta V_0}{\Delta V_{id}} = \frac{V_{01} - V_{02}}{V_{i1} - V_{i2}} \approx 7.7 \qquad (1)$$

|V$_{id}$| max≈0.4V

Operation of the Circuit

The operation of the circuit assumes all pairs of transistors are matched, and the transistors operate in saturation in order to have the characteristics of a differential amplifier. With the use of NMOS saturation equation, we can show that this circuit has a differential output of:
Vo=−sqrt[(W1/L1)/(W3/L3)](1/(1+χ))=about 7.4 where χ=Gmb/Gm and Gmb is the body transconductance,
typical value 0.1<χ<0.3
and, Vidmax=sqrt(2)(Vgs1−Vt)assuming Vt1=Vt2.

Figure 2:
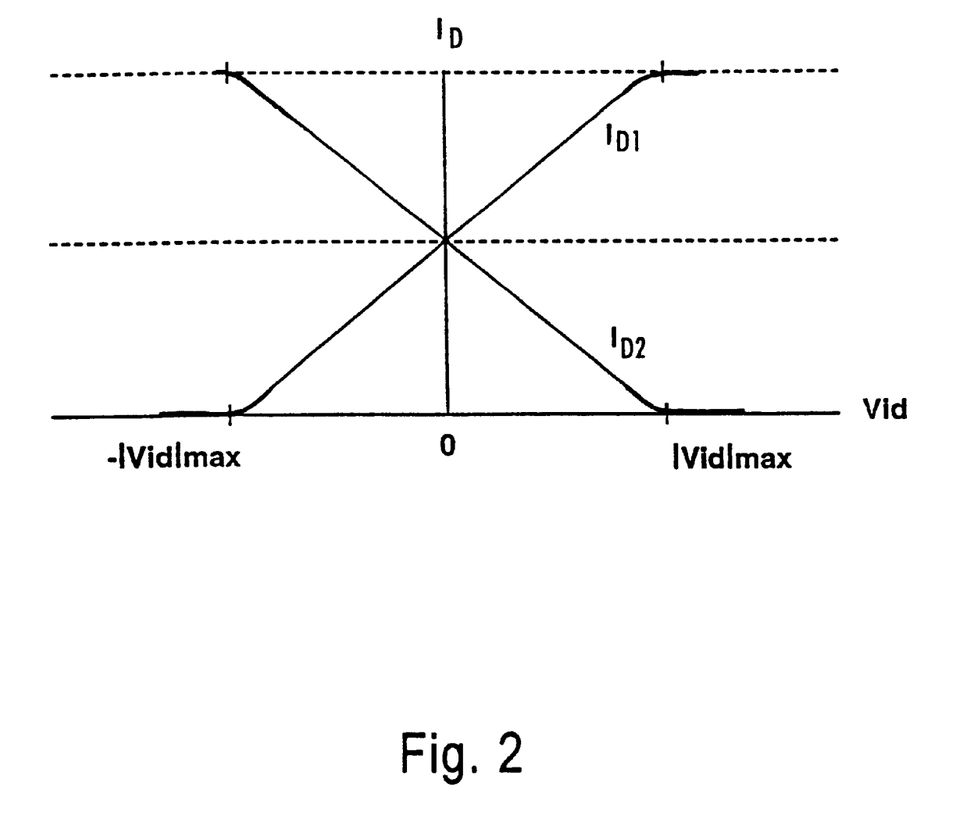
FIG. 2 is a graph of the differential gain region of the Ids-Vid characteristic of a differential amplifier.

FIG. 2 shows the differential gain region and the Ids–Vid characteristic of a differential amplifier.

Figure 3:
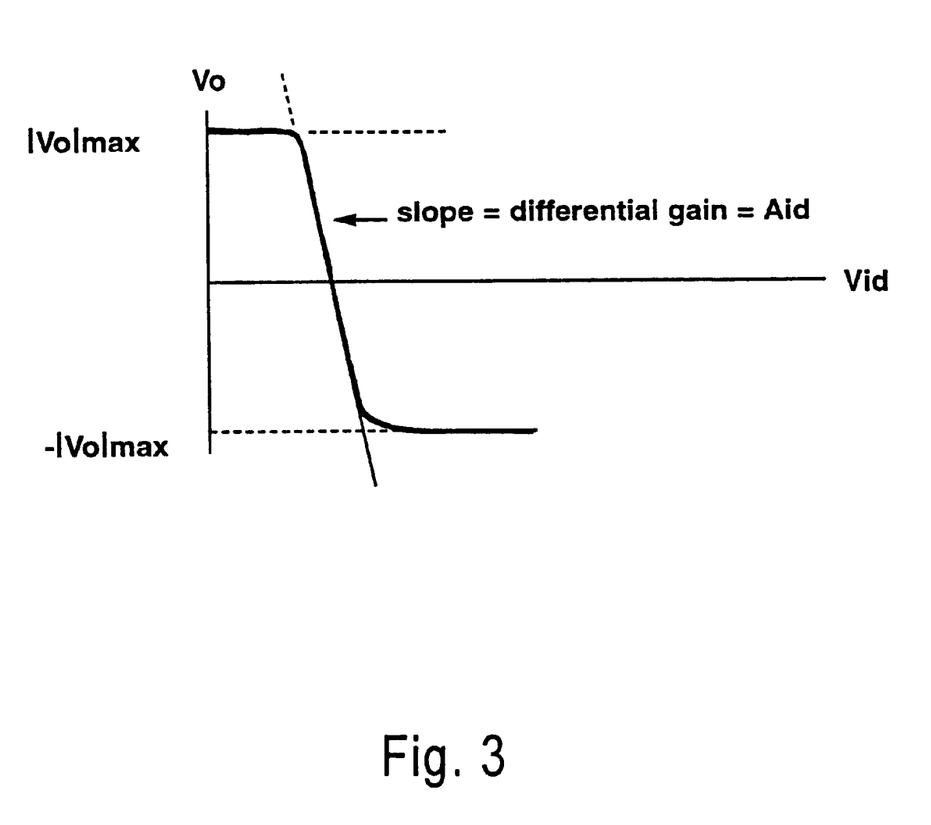
FIG. 3 is a graph of the linear differential gain region used for a determination of Aid.

FIG. 3 shows the linear differential gain region, and the determination of Aid.

The Current Source

The current source is formed by implementing a simple current mirror of two matched transistors M5 and M6. The reference current of the current mirror is able to provide more current than the pull-up NMOS devices can supply. The current on the other side of the current mirror is limited by the two smaller pull-up NMOS transistors, regardless of what the reference current may be.

The Offset Voltage

Figure 4:
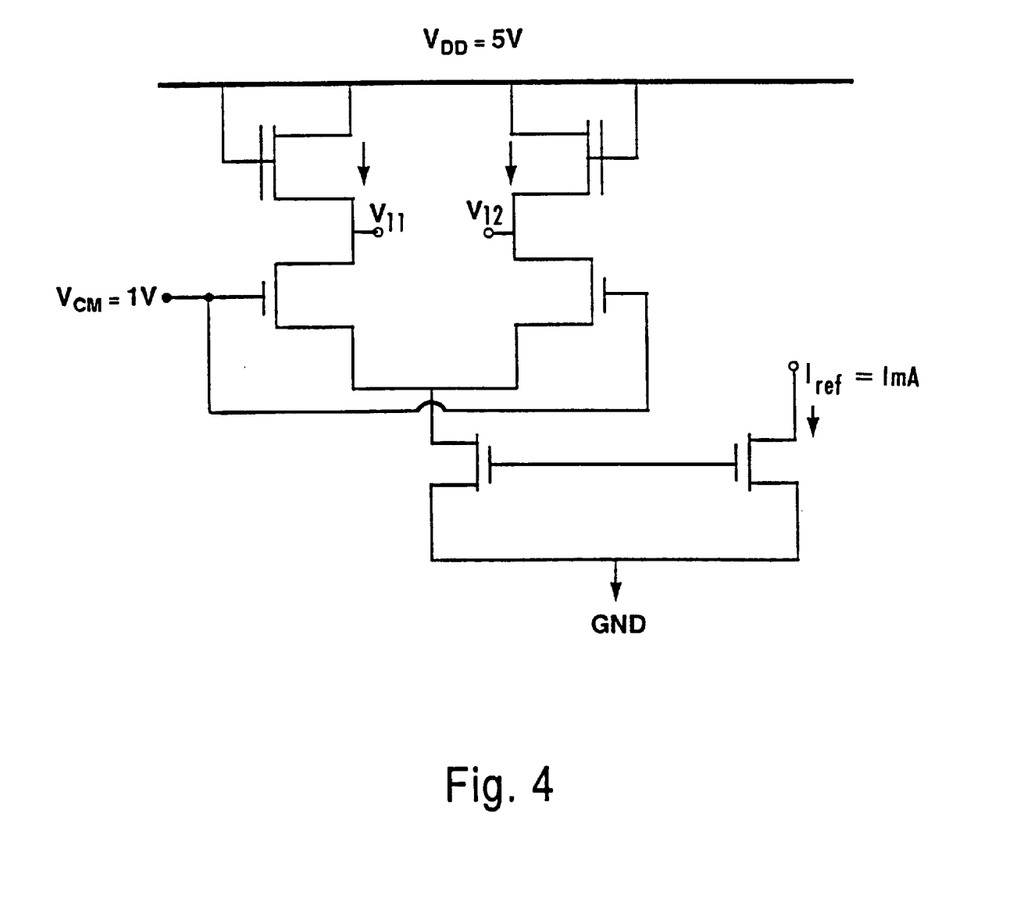
FIG. 4 is a schematic diagram of a differential amplifier connected for measuring Voffset.

The offset voltage is described in the reference to FIG. 4. All devices operate in the saturation region Voffset=Vo1−Vo2.

Assuming Vt=0.65 V and with Vcm=Vi1=Vi2=1V, all devices operate in the saturation region. Since all pairs of the devices are matched, Voffset=Vo1−Vo2=0V. But some mismatch in W, L and Vt would cause Voffset<>0V.

Figure 5:
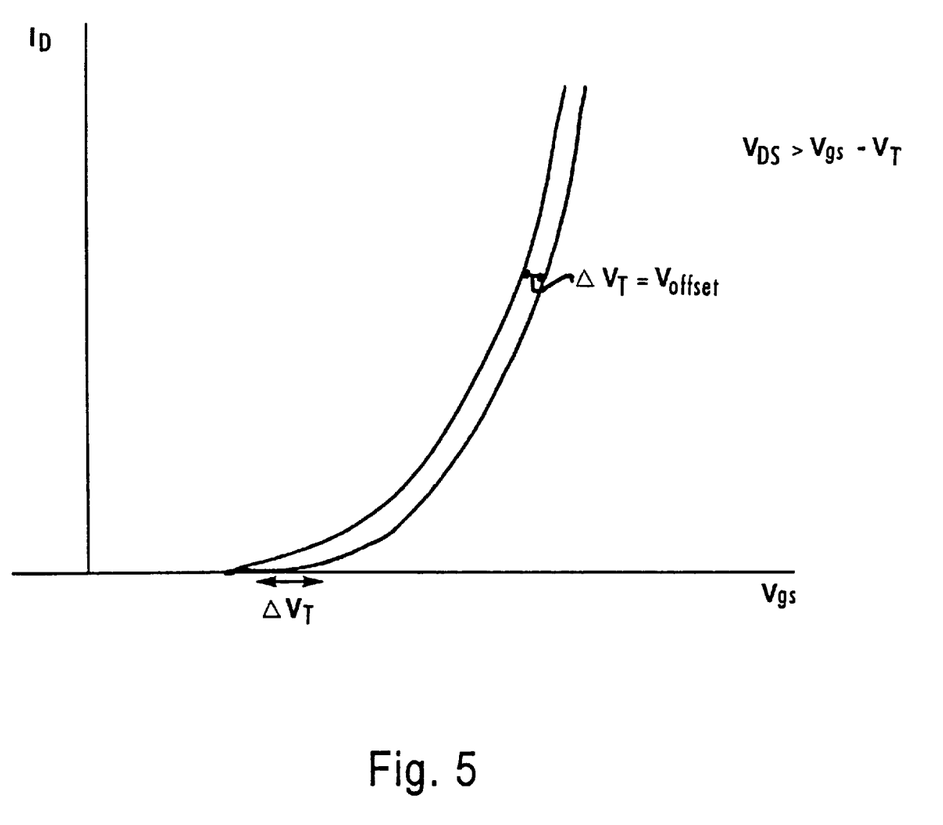
FIG. 5 is a graph illustrating how Voffset results in a shift in the Ids-Vgs characteristic curve from what would exist with no offset.
Figures 6, 7:
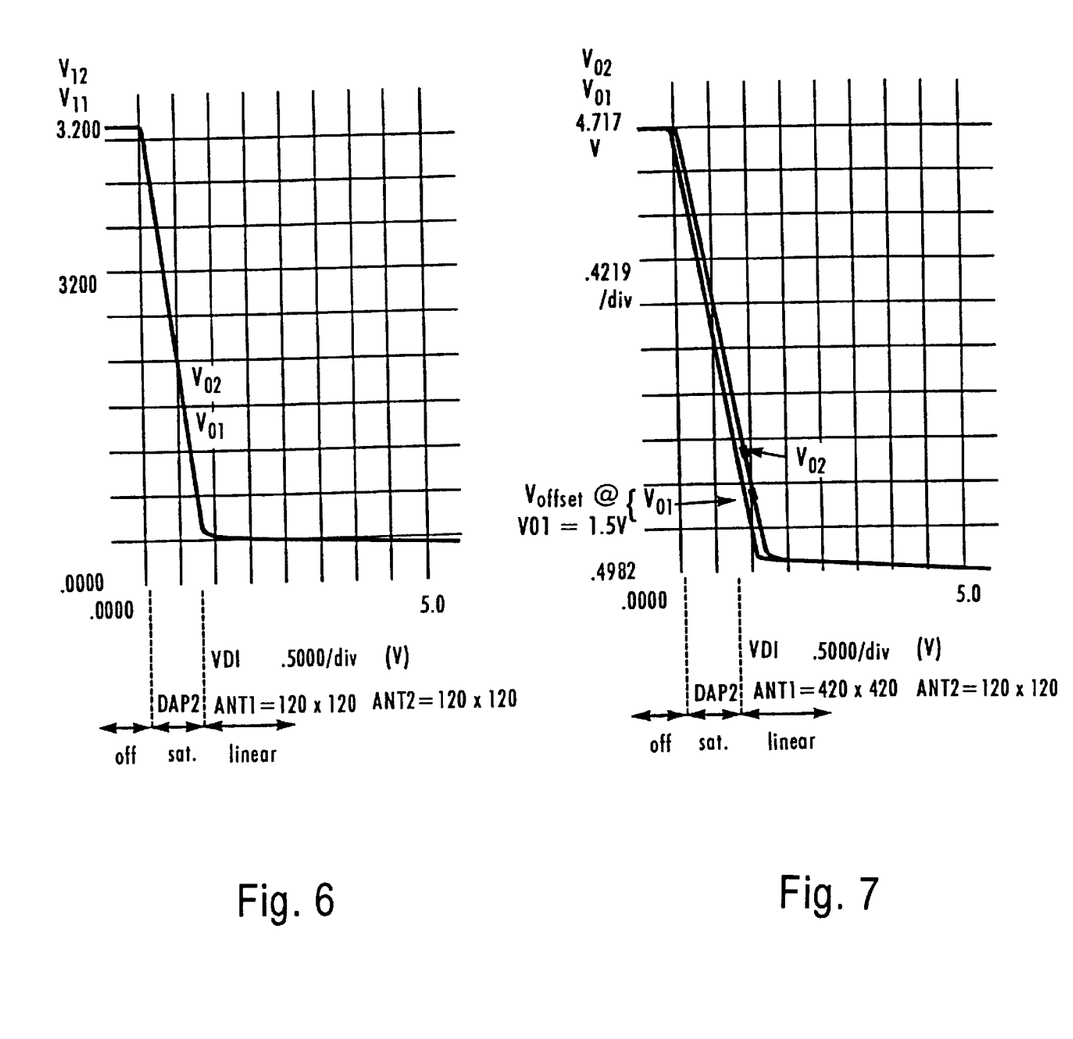
FIG. 6 is a graph of output voltage as a function of common mode input voltage with same antenna size on each input.
FIG. 7 is a graph of output voltage as a function of common mode input voltage with different antenna sizes.

If we assume that mismatch in W and L are small or insignificant in all devices, then Voffset=$\Delta$Vt by assuming that the Ids-Vgs characteristics are preserved but shifted by $\Delta$Vt. FIG. 5 illustrates this assumption:

FIGS. 6 and 7 show the output voltages as a function of common mode input voltage. The input devices go from off to saturation, and then to linear region of operation with increasing Vcm.

FIG. 6 was obtained using a DAP2 structure with antenna sizes of 120×120 and 120×120. It virtually shows no offset voltage. FIG. 7 shows large offset voltage for the circuit with antenna sizes 420×420 and 120×120.

Experiment

It is expected that some form of oxide damage is induced by plasma or other destructive processes during IC processing. With a bigger antenna (capacitor) connected to the gate, one might expect that oxide damage would be decreased. The research was directed to see if any relationship existed between Voffset and $\Delta$Vt, Voffset and antenna size, Voffset and $\Delta$Vt, and $\Delta$Gm. The experiment hypothesized that Voffset was more sensitive (that is, easier to detect) that $\Delta$Vt and $\Delta$Gm.

The Vt, Gm, Aid, and Voffset can be obtained by a HP4145B test instrument. The differential gain Aid can be obtained by calculation from the plotting of Vo vs. Vid on the HP4145B.

Characteristics of the Circuit

Long channel devices (L=2 $\mu$m) are implemented to avoid short-channel effect.

Aid=7.9 (theoretical)
Vidmax=0.4 volt (experimental)
Ids1max=Ids2max=400 $\mu$A (experimental)

Figure 8:
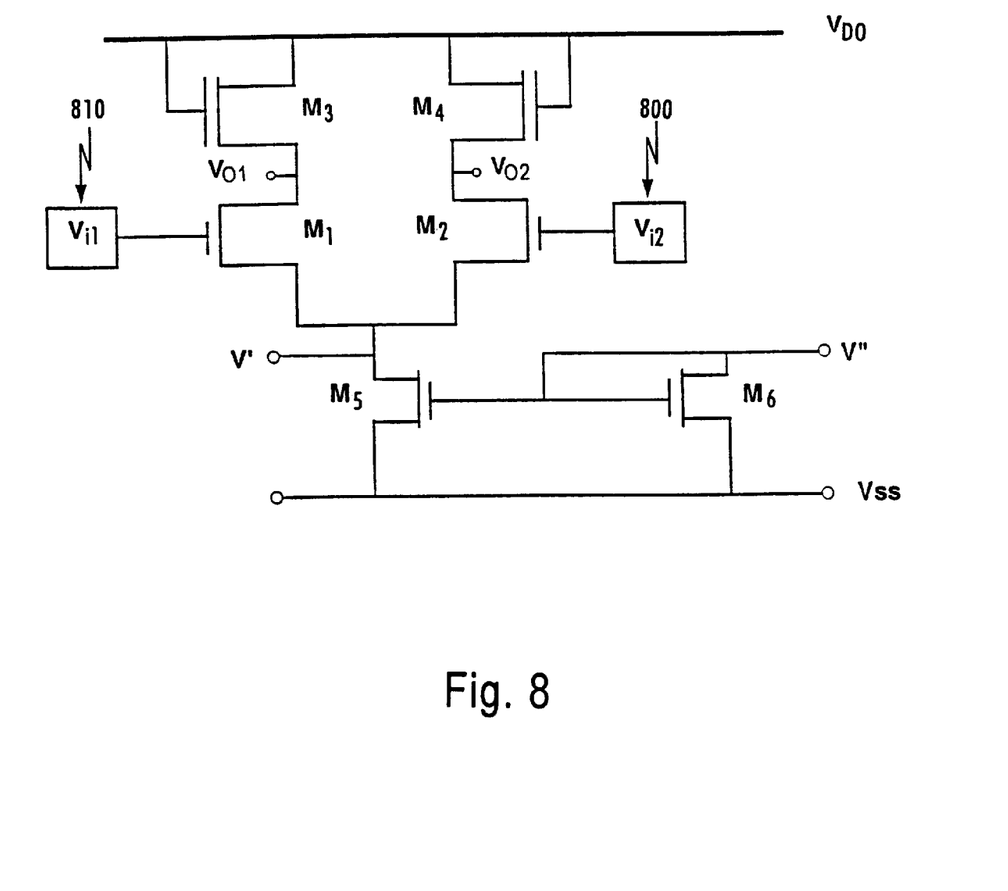
FIG. 8 is a schematic diagram of a differential amplifier implemented in accordance with the invention having different sized antenna.

FIG. 8 is a schematic diagram of a differential amplifier implemented in accordance with the invention by having different sized antenna implemented on the input gates. A reference sized antenna (800), for example 120×120 $\mu$m is fabricated on one input whereas a larger antenna (810), for example, 420×420 $\mu$m is fabricated on the other input.

Figure 9:
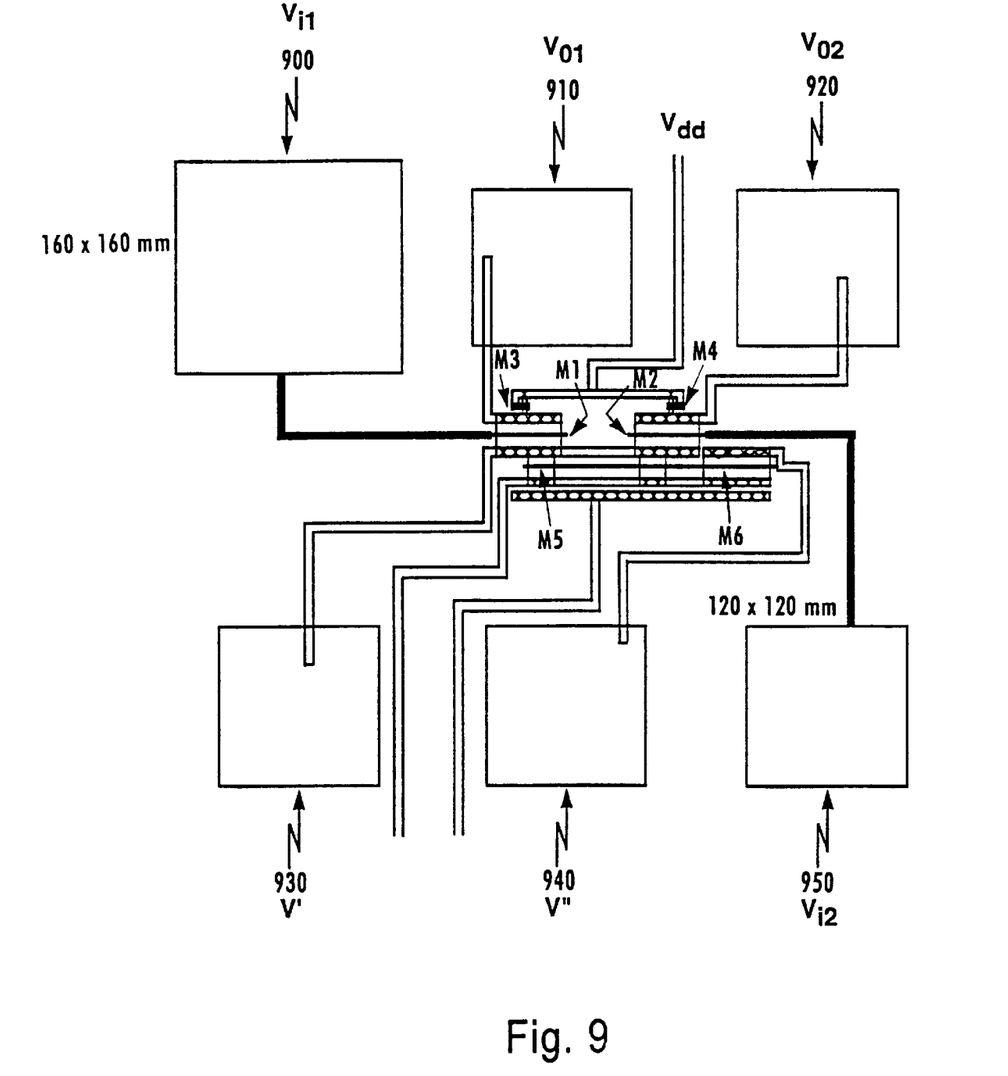
FIG. 9 is an exemplary layout of a differential amplifier of the type shown in FIG. 8 for implementation on a semiconductor.

FIG. 9 is an exemplary layout of a differential amplifier of the type shown in FIG. 8 for implementation on a semiconductor. Labels utilized in FIG. 8 are carried forward to this figure and label corresponding points in the circuit. In this particular view, one cannot see the fact that the antenna structures representing input points Vi1 and Vi2 are constructed of a multilevel stack.

Figure 10:
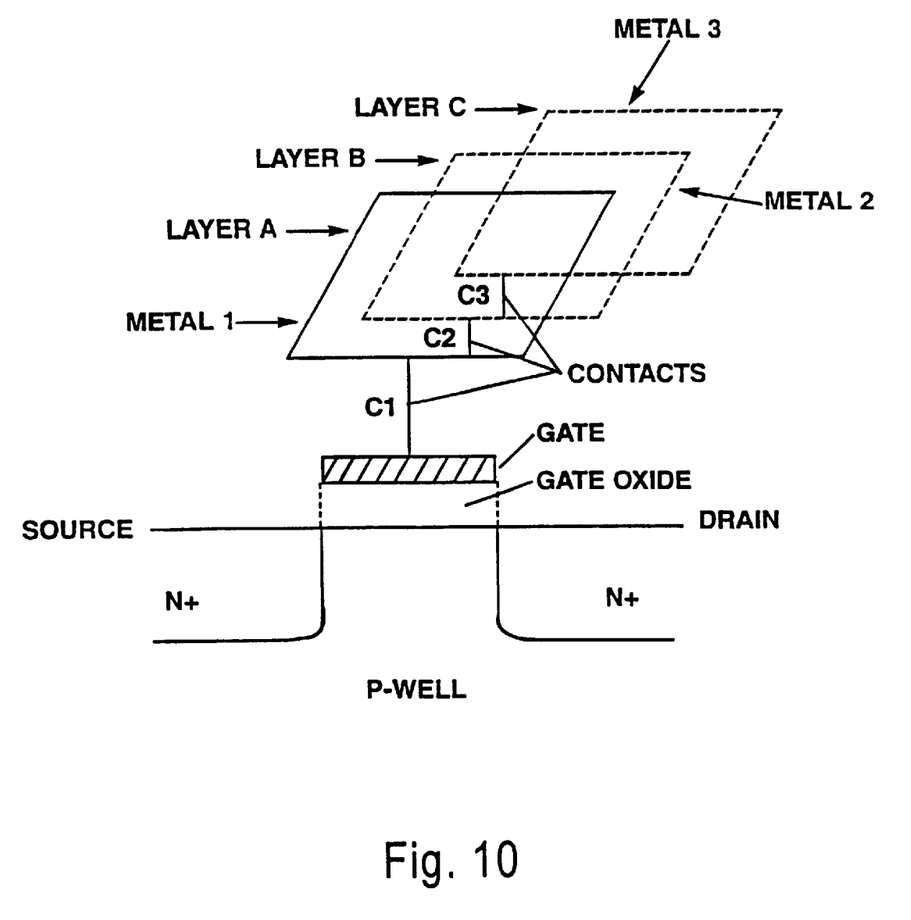
FIG. 10 illustrates a multilevel antenna structure which can be used to implement antennas in accordance with the invention.

FIG. 10 illustrates a multilevel antenna structure which can be used to implement antennas in accordance with the invention. The gate contact from the MOSFET connects to layer A over path C1. Layer A connects to layer B over path C2 as shown and layer B connects to layer C over path C3. The paths shown are symbolic of a through-the-layer contact which enables the three layers to be connected electrically even though separated by an insulation layer.

Information on DAP1 Through DAP5

Each of the experimental setups DAP1–DAP5 included a differential amp shown in FIG. 8 with one input gate having an antenna of fixed 120×120 $\mu$m size. The size of the antenna connected to the other input gate was then varied from 120×120 $\mu$m to 160×160 $\mu$m to 320×320 $\mu$m and 420×420 $\mu$in different versions of each set up.

Setup DAP1 used no diode input protection and implemented 3 antenna layers L1–L3.

Setup DAP2 used a 1.5×1.5 $\mu$m$^2$ n+/p diode protection and implemented 3 antenna layers L1–L3.

Setup DAP3 used a 3.0×3.0 $\mu$m$^2$ n+/p diode protection and implemented 3 antenna layers L1–L3.

Setup DAP4 used no diode protection and implemented two antenna poly layers L3 and L4.

Setup DAP5 used a 1.5×1.5 $\mu$m n+/p diode protection and implemented two antenna poly layers L3 and L4.

The basis principle behind this technique is to implement two antennas of different sizes at the inputs of the differential amplifier as shown in FIG. 8. The difference in damage to the gate oxide of different input antenna areas will be amplified at the outputs. In this case, the output offset voltage will be measured.

Two types of antennas are implemented here: One is a stack of metal 1 through metal 3 layers, and each layer of the metal area is the same as the other; another type of antenna is a stack of polysilicon through metal 3 layers.

$V_{th}$ for a MOSFET is substantially 0.65V. $V_{cm}$ is set to 20–25% higher than $V_{th}$ for the measurements, or to around 0.8V.

The following are the conditions for which the I–V parameters were measured:

Ids in the saturation: Vgs=0.8V=Vth+(20–25% of Vth), Vds=0.22V or >Vgs–Vth
Idlin: Vgs=3.3 and Vds=0.1V
Gmsat: Vgs=3.3 and Vds=0.1V; Vds=3.3 V, maximum slope extrapolation
Gmlin: Vgs=3.3 and Vds=0.1V; Vds=0.1V, maximum slope extrapolation
Vtlin: Vgs=3.3 and Vds=0.1V; Vds=0.1V, maximum slope extrapolation
$\Delta$Ids=Ids (larger antenna)–Ids (reference antenna), where the reference antenna ratio–144.

Figure 11:
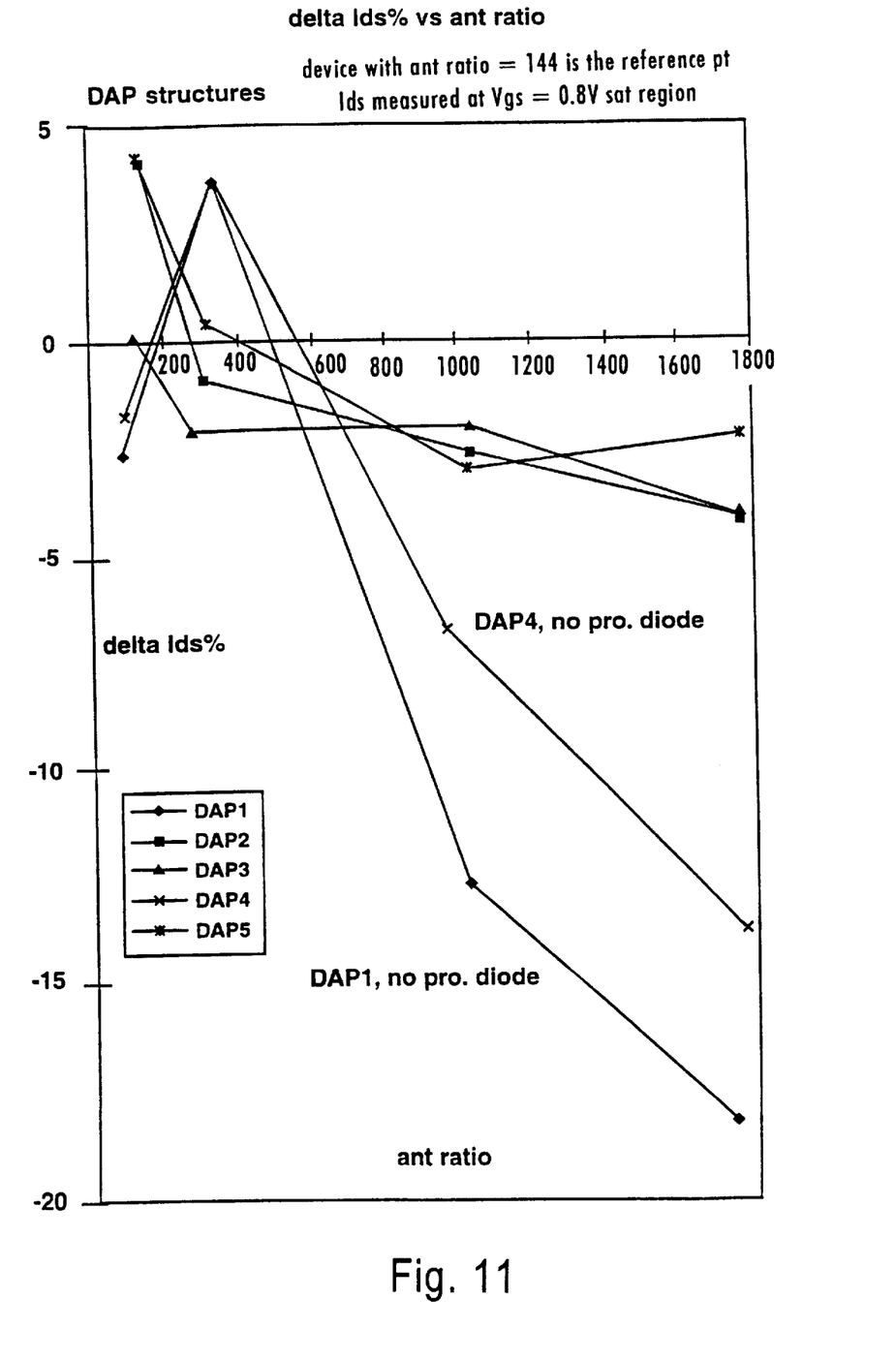
FIG. 11 illustrates experimental results showing the change in $\Delta$Ids (%) as a function of antenna ratio.

FIG. 11 illustrates experimental results showing the change in $\Delta$Ids (%) as a function of antenna ratio. As shown in FIG. 11, each of the experimental setups DAP1 and DAP4 exhibit pronounced sensitivity to process induced damage. Both of these setups did not utilize a protection diode. However, those setups which did not use a protection diode, namely DAP2, DAP3 and DAP5 were limited to only a few percent variations as the antenna ratio changed. However, at the largest antenna ratios, substantial variations in Ids were observed for the same quantities of process induced damage. Thus, by knowing the antenna ratio of the differential amplifier in accordance with the invention implemented on the semiconductor chip, and by knowing a value for Ids when the antenna sizes are the same, one may infer, with a high degree of accuracy the amount of process induced damage suffered by the differential amplifier during fabrication by measuring the value for Ids. This will permit an inference to be made about damage to other components on the chip or wafer being fabricated.

Figure 12:
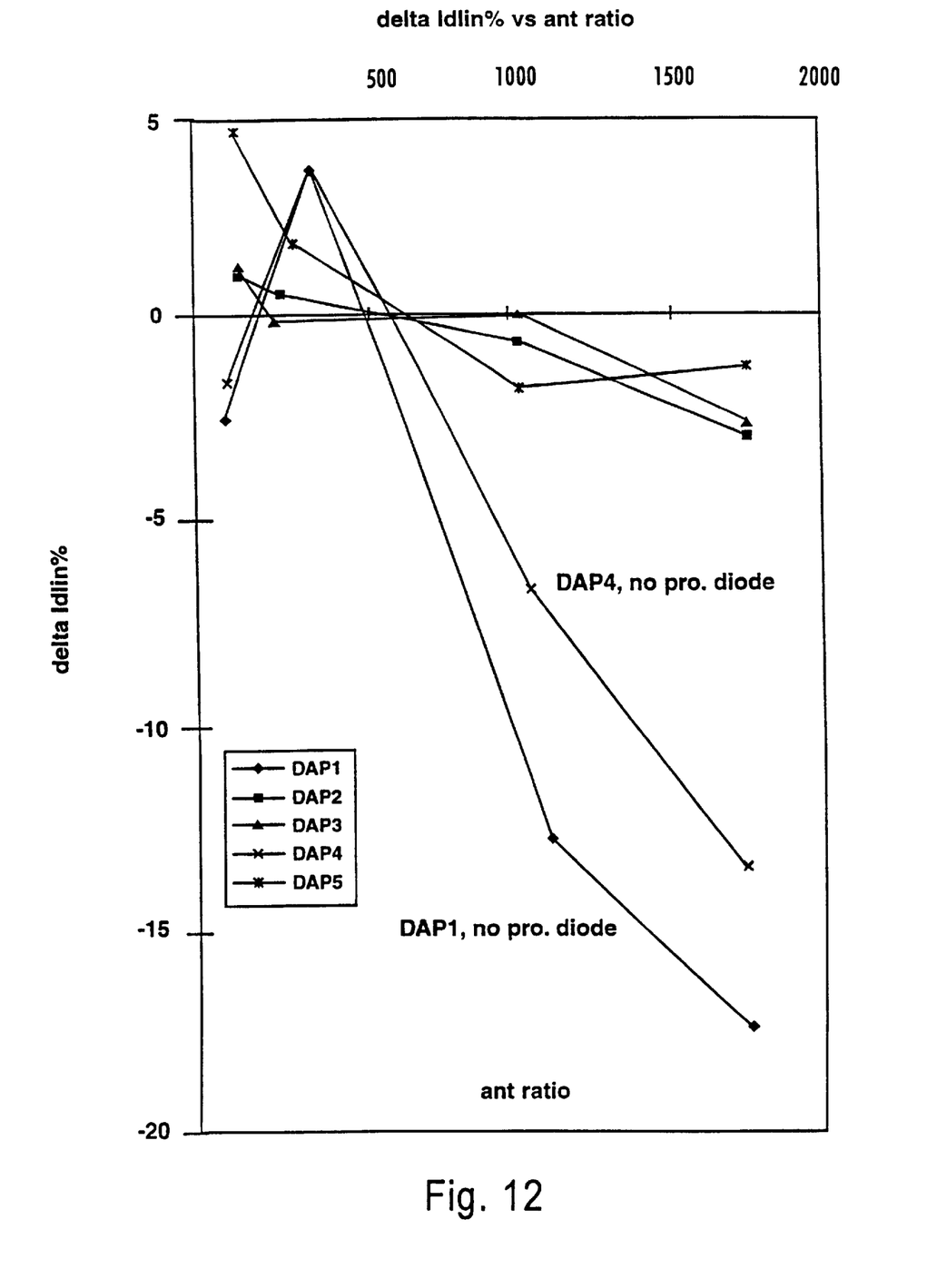
FIG. 12 illustrates experimental results showing the change in $\Delta$Idlin (%) as a function of antenna ratio.

FIG. 12 illustrates experimental results showing the change in $\Delta$Idlin as a function of antenna ratio. Again, DAP1 and DAP4 show considerable sensitivity as a function of antenna ratio. Although these results could be used in the same way as discussed in conjunction with FIG. 11, the measurement of Ids as opposed to the measurement of Idlin is preferred.

Figure 13:
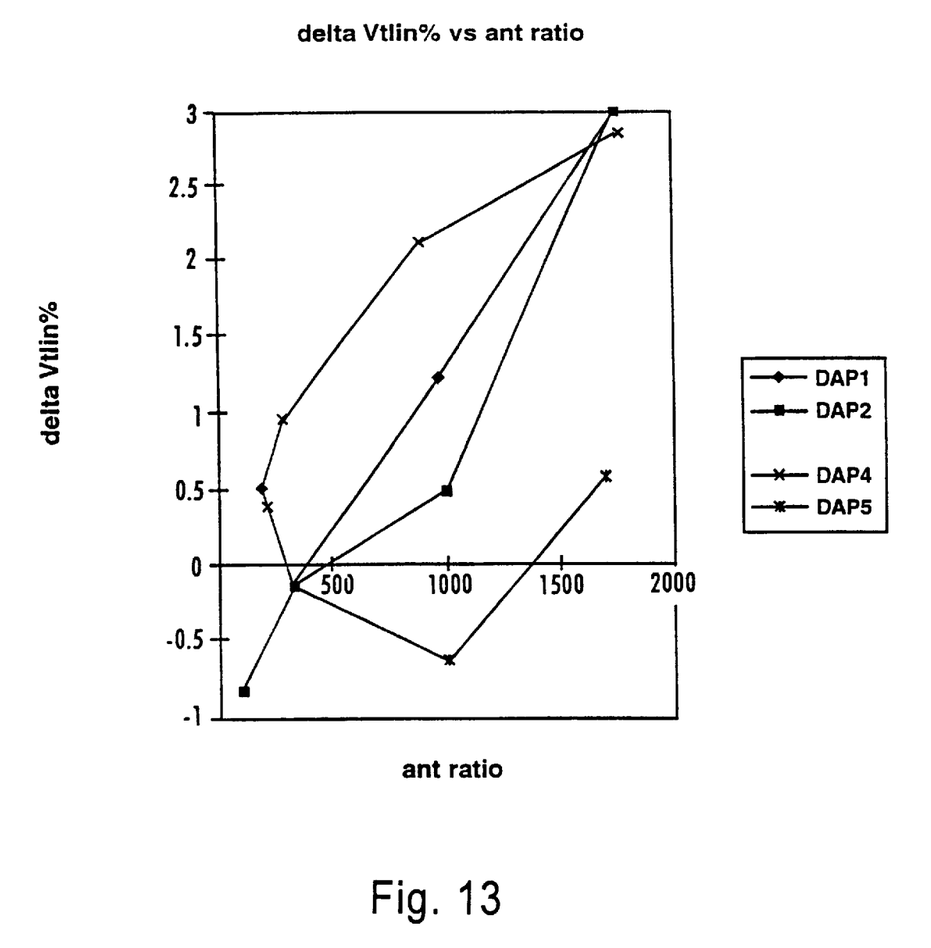
FIG. 13 illustrates experimental results showing the change in $\Delta$Vtlin (%) as a function of antenna ratio.

FIG. 13 illustrates experimental results showing the change in $\Delta$Vtlin (%) as a function of antenna ratio.

Figure 14:
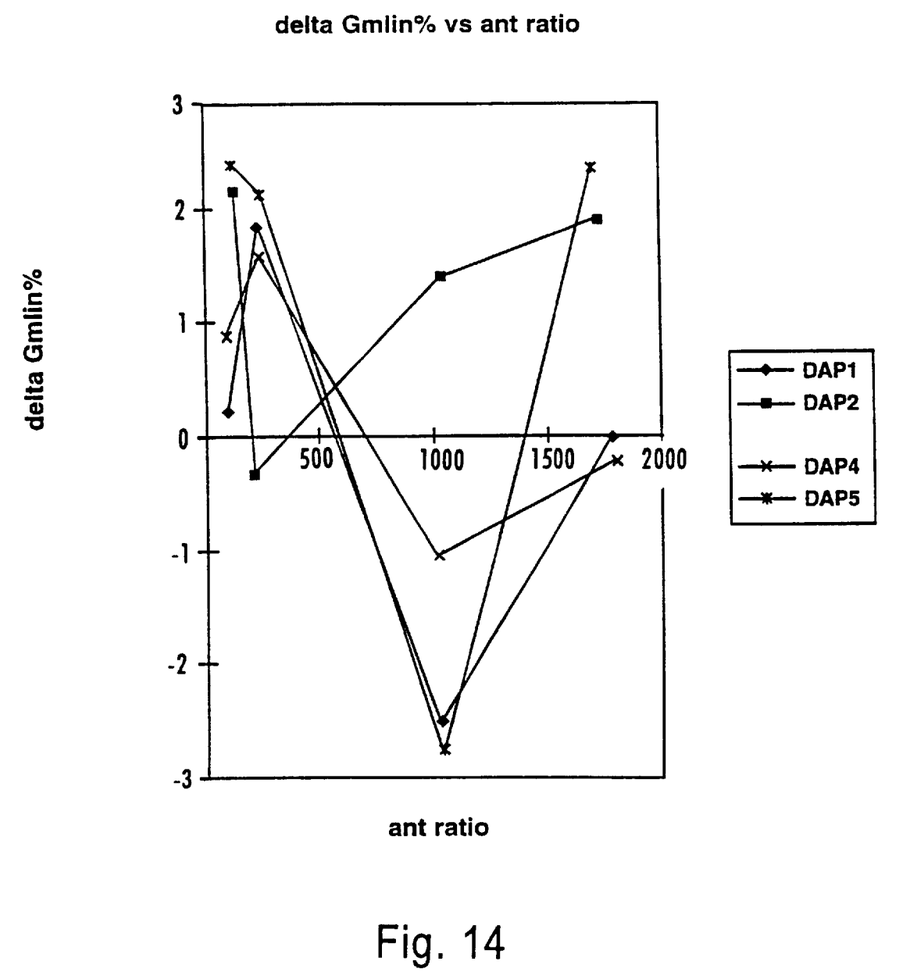
FIG. 14 illustrates experimental results showing the change in $\Delta$Gmlin (%) as a function of antenna ratio.

FIG. 14 illustrates experimental results showing the change in $\Delta$Gmlin (%) as a function of antenna ratio.

Figure 15:
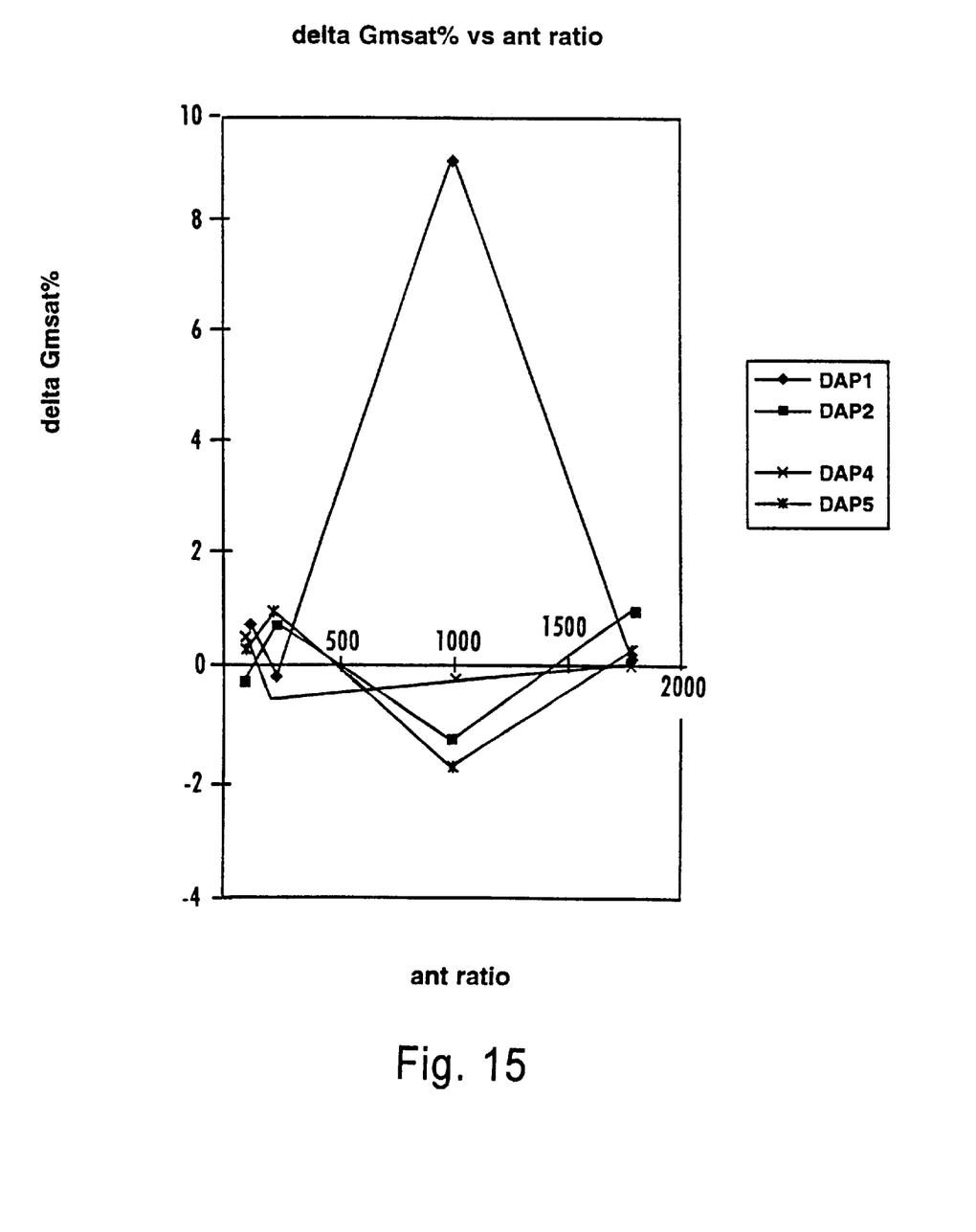
FIG. 15 illustrates experimental results showing the change in $\Delta$Gmsat (%) as a function of antenna ratio.

FIG. 15 illustrates experimental results showing the change in $\Delta$Gmlin (%) as a function of antenna ratio.

Each of these graphs shows a parameter previously utilized as a measure of quality of a fabricated semiconductor. However, as can be seen each of these measures provides only a variation of a few percent and does not have near the sensitivity of the Ids measure discussed above. Therefore, the measure of Ids as discussed above provides a much superior measure and indicator of quality of an overall fabricated device than any of these variables would.

In use, the application of one or more differential amplifiers with antenna ratios selected as discussed above provides the opportunity for quick measurement of process induced damage on the antennas from which inferences may be made about process induced damage to other areas of a semiconductor product, such as a MOSFET, integrated circuit of semiconductor wafer. The improved precision and accuracy with which one may infer process induced damage as a result of fabrication offers improved control over damaging processes such as plasma etching or ion implantation.

Computer control test equipment can be utilized to implement the measurement of process induced damage as discusses above. A typical installation might include a test or measurement instrument, one or more test fixtures for holding the semiconductor product and for providing connections between the test instrument and at least one of the differential amplifiers to be tested on the semiconductor product. Equipment of this nature is well known in the art and, typically, includes computer controlled automatic test probes which, under control of robotic actuating mechanisms, position test probes automatically at precise locations on a semiconductor substrate or other semiconductor body being tested. Such automated testing can occur as part of a semiconductor fabrication line.

Figure 16:
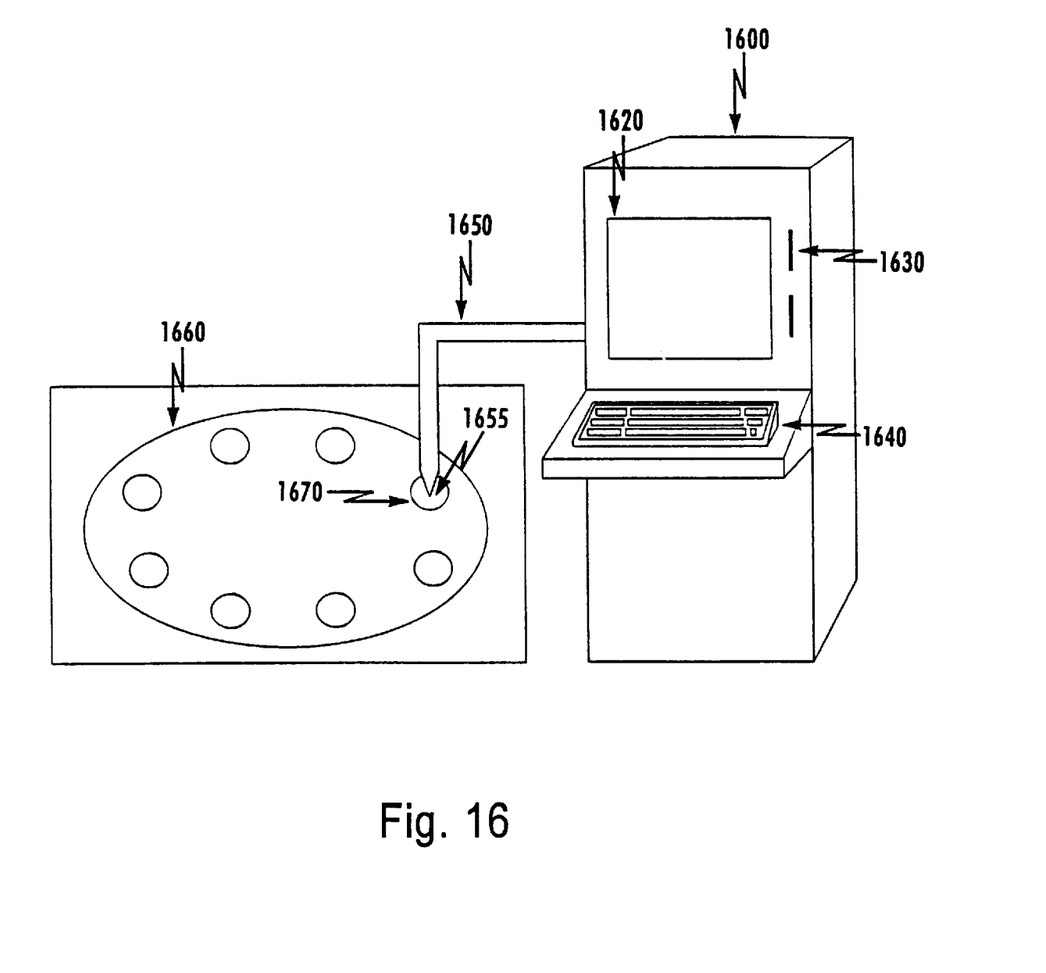
FIG. 16 is an illustration of automatic test apparatus of the prior art.

FIG. 16 is an illustration of automatic test apparatus of the prior art. The apparatus comprises a wafer tester 1600 and a wafer presentation system 1660. Wafer tester 1600 has an automatic test probe 1655 controlled by a positioning mechanism 1650 which operates under control of a tester controller mounted within the cabinet of the wafer tester. The tester controller incorporates a computer with an input device, such as keyboard 1640, disc drives 1630, and a visual display 1620. The tester control application software controls the location of positioning arm 1650 to place the automatic test probe 1655 over the precise point on the wafer where tests are to be conducted. The probe is then lowered into contact with the wafer, measurements are made and recorded, and the automatic test probe positioned to a pint on the wafer where the next measurement is to be taken. Wafers may be tested one at a time or positioned on a presentation mechanism 1660, such as a carousel where wafers may be rotated sequentially to positions within the reach of positioning arm 1650 and its probe. Each wafer 1670 contains a plurality of semiconductor devices, such as integrated circuits, each of which is to be tested. The tester controller sequences the test probe through the positions needed to make a test on each integrated circuit on the wafer. This may be done by taking one measurement from each of the integrated circuits on the wafer before progressing to a second measurement to be taken from each of the integrated circuits on the wafer or, alternatively, all measurements for an integrated circuit can be taken at one time before moving on to the next integrated circuit of the wafer.

The actual testing of a product can occur after a finished semiconductor product has been made or it can occur during fabrication of the product. That is, during fabrication, a differential amplifier can be formed as an intermediate step prior to fabrication of a device and can accumulate process induced damage during the entire fabrication process of the device being fabricated. Alternatively, a differential amplifier can be formed together with the actual product being tested or can be formed as part of the actual product being bested and utilized to test the end product.

By using a single measure of quality, the evaluation of the fabrication process can be speeded and at the same time, the improved sensitivity provides for greater reliability by permitting better control of the manufacturing process. Thus, the cost of manufacturing should be reduced while the quality of the resulting end product should be improved.

Thus, the problems of the prior art are overcome and significant benefits are achieved during the manufacture of semiconductor products.

In this disclosure, there is shown and described only the preferred embodiment of the invention, but, as aforementioned, it is to be understood that the invention is capable of use in various other combinations and environments and is capable of changes or modifications within the scope of the invention concept as expressed herein.

We claim:

1. A method evaluating process induced damage during fabrication of a semiconductor product, comprising the steps of:

a. forming a differential amplifier on said semiconductor product, said differential amplifier having first and second inputs with said first input connected to a gate of a first MOSFET and said second input connected to a gate of a second MOSFET, said first input connected also to a first size antenna and said second input connected also to a second, different size antenna, with said differential amplifier and each antenna being formed on the semiconductor product during fabrication;

b. inducing test signals to said semiconductor product; and c. measuring a difference between the drain source current of the first MOSFET and the drain source current of the second MOSFET ($\Delta$Ids) or a difference between the drain current of the first MOSFET and the drain current of the second MOSFET when the first and second MOSFETs are operating in a linear region ($\Delta$Idlin), as an indication of the amount of process induced damage the product suffered during fabrication.

2. The method of claim 1 in which said semiconductor product is an integrated circuit.

3. The method of claim 1 in which said semiconductor product is a semiconductor wafer.

4. A method of evaluating process induced damage during fabrication of a semiconductor product, comprising the steps of:

a. forming a differential amplifier on said semiconductor product, said differential amplifier having first and second inputs with said first input connected to a gate of a first MOSFET and said second input connected to a gate of a second MOSFET, said first input connected also to a first size antenna and said second input connected also to a second, different size antenna, with said differential amplifier and each antenna being formed on the semiconductor product prior to fabrication;

b. inducing test signals to said semiconductor product; and c. measuring a difference between the drain source current of the first MOSFET and the drain source current of the second MOSFET ($\Delta$Ids) or a difference between the drain current of the first MOSFET and the drain current of the second MOSFET when the first and second MOSFETs are operating in a linear region ($\Delta$Idlin), as an indication of the amount of process induced damage the product suffered during fabrication.

* * * * *